(12) United States Patent
Zhang et al.

(10) Patent No.: US 11,350,533 B2
(45) Date of Patent: May 31, 2022

(54) TENSION LOCK AND LED DISPLAY SCREEN BOX

(71) Applicant: SHENZHEN GLOSHINE TECHNOLOGY CO., LTD., Guangdong (CN)

(72) Inventors: Xianfeng Zhang, Guangdong (CN); Yongjun Zhang, Guangdong (CN); Guoqiang Li, Guangdong (CN); Jiawei Cao, Guangdong (CN)

(73) Assignee: SHENZHEN GLOSHINE TECHNOLOGY CO., LTD., Shenzhen (CN)

(*) Notice: Subject to any disclaimer, the term of this patent is extended or adjusted under 35 U.S.C. 154(b) by 283 days.

(21) Appl. No.: 16/802,509

(22) Filed: Feb. 26, 2020

(65) Prior Publication Data
US 2020/0284074 A1    Sep. 10, 2020

Related U.S. Application Data

(63) Continuation of application No. PCT/CN2020/072989, filed on Jan. 19, 2020.

(30) Foreign Application Priority Data

Mar. 5, 2019    (CN) .......................... 201910164352.3

(51) Int. Cl.
 *H05K 5/02*    (2006.01)
 *H05K 5/00*    (2006.01)
 (Continued)

(52) U.S. Cl.
 CPC ............. *H05K 5/0221* (2013.01); *F16B 2/18* (2013.01); *H05K 5/0004* (2013.01); *H05K 5/0017* (2013.01); *H05K 5/03* (2013.01)

(58) Field of Classification Search
 CPC .. H05K 5/0221; H05K 5/0004; H05K 5/0017; H05K 5/03; E05C 5/04;
 (Continued)

(56) References Cited

U.S. PATENT DOCUMENTS 6,408,659 B1    6/2002  Chang
7,117,563 B2 *  10/2006 Chen ..................... G06F 1/1616
                                                16/303

(Continued)

FOREIGN PATENT DOCUMENTS

CN    203055361 U    7/2013
CN    105485105 A    4/2016
(Continued)

OTHER PUBLICATIONS

Translation of CN 208456969 (Year: 2022).*
Search report of counterpart European Patent Application No. 20705123.6 dated Aug. 2, 2021.

*Primary Examiner* — Hung S. Bui
*Assistant Examiner* — Sagar Shrestha

(57)    ABSTRACT

The application belongs to the technical field of LED display screen box assembly, and relates to a tension lock and LED display screen box. The tension lock comprises a base, a rotating shaft, a shim and a knob, wherein the base is provided with a sliding hole, one end of the rotating shaft is fixedly connected with the knob, the other end of the rotating shaft is inserted into the sliding hole, the shim is rotationally connected with the rotating shaft, and the distance between the shim and the knob is kept constant; Turning the knob can make the rotating shaft rotate and slide along the axial direction of the sliding hole to make the shim move away from or close to the base. The tension lock can effectively improve the installation efficiency of LED display screen box.

9 Claims, 11 Drawing Sheets

(51) Int. Cl.
  *H05K 5/03* (2006.01)
  *F16B 2/18* (2006.01)
(58) Field of Classification Search
  CPC .......... E05B 65/006; F16B 2/18; F16B 21/04;
   E05Y 2900/606; H01L 27/32
  See application file for complete search history.

(56) References Cited

U.S. PATENT DOCUMENTS

| | | | |
|---|---|---|---|
| 8,708,595 B2* | 4/2014 | Tseng | F16B 5/0092 403/325 |
| 9,850,928 B2 | 12/2017 | Bowers et al. | |
| 2009/0031531 A1* | 2/2009 | Chang | G06F 1/1679 16/333 |
| 2011/0027038 A1* | 2/2011 | Hsu | H01L 23/4093 411/105 |
| 2012/0227257 A1* | 9/2012 | Kalavitz | F16B 21/04 29/525.01 |
| 2013/0104342 A1* | 5/2013 | Sano | G06F 1/1681 16/297 |
| 2013/0279968 A1* | 10/2013 | Li | H05K 7/02 403/27 |
| 2016/0255731 A1* | 9/2016 | Ran | E05B 15/08 361/807 |
| 2017/0074303 A1* | 3/2017 | Bowers | F16B 5/10 |
| 2017/0238430 A1* | 8/2017 | Moon | H05K 5/0204 361/679.01 |
| 2019/0316623 A1* | 10/2019 | Cai | F16B 21/04 |
| 2021/0071452 A1* | 3/2021 | Tomao | E05B 5/00 |
| 2021/0378111 A1* | 12/2021 | Hao | H05K 5/0021 |

FOREIGN PATENT DOCUMENTS

| | | |
|---|---|---|
| CN | 207182822 U | 4/2018 |
| CN | 208456969 U | 2/2019 |
| CN | 208477863 U | 2/2019 |

* cited by examiner

TENSION LOCK AND LED DISPLAY SCREEN BOX

CROSS REFERENCE TO RELATED APPLICATIONS

The present application is a Continuation Application of PCT Application No. PCT/CN2020/072989 filed on Jan. 19, 2020, which claims the benefit of Chinese Patent Application No. 201910164352.3 filed on Mar. 5, 2019. All the above are hereby incorporated by reference.

TECHNICAL FIELD

The application belongs to the technical field of LED display screen box assembly, in particular to a tension lock and an LED display screen box.

BACKGROUND

The LED display box usually includes an LED display module and a power module. The power module is provided with a pin header, and the LED display module is provided with a female header. The power module is installed on the LED display module through the plug-in between the pin header and the female header.

In the prior art, plugging and unplugging between the pin header and the female header are usually completed manually to realize the installation of the LED display box. However, due to the pin header on the power module and the female header on the LED display module are tightly plugged, and manual plugging and unplugging takes time and effort, the installation efficiency of LED display screen box is relatively low.

SUMMARY

The aim of the application is to provide a tension lock and an LED display screen box to solve the technical problem that the installation mode of the existing LED display screen box is time-consuming and laborious.

In order to solve the above technical problem, in one respect, the embodiment of the present application provides a tension lock, which comprises a base, a rotating shaft, a shim and a knob, wherein a sliding hole is arranged on the base, one end of the rotating shaft is fixedly connected with the knob, the other end of the rotating shaft is inserted into the sliding hole, the shim is rotationally connected to the rotating shaft, and the distance between the shim and knob is kept constant;

Turning the knob can make the rotating shaft rotate and slide along the axial direction of the sliding hole, so that the shim can move away from or close to the base.

According to the tension lock of the embodiment of the present application, by turning the knob, the rotating shaft rotates and slides along the axial direction of the sliding hole, so that the shim is away from or close to the base. When the tension lock is applied to the installation of LED display screen box, the base can be fixedly connected with the box frame, and the shim can be fixedly connected with the rear cover. Turning the knob, when the rotating shaft slides along the axial direction of the sliding hole toward the base, the shim gradually approaches the base, and the shim will drive the rear cover to gradually approach the box frame to assist the connection between the rear cover and the box frame; when the rotating shaft slides along the axial direction of the sliding hole in a direction away from the base, the shim gradually moves away from the base, and the shim will drive the rear cover to gradually move away from the box frame, so as to gradually remove the connection between the rear cover and the box frame, to separate the rear cover and the box frame from each other. In this way, installation and disassembly of LED display screen box are faster and more convenient, and the installation efficiency of LED display screen box is effectively improved.

Optionally, the rotating shaft comprises a small tube section and a large tube section, the small tube section is fixedly connected with the knob, and the large tube section is inserted into the sliding hole and can slide along the axial direction of the sliding hole;

a step surface is formed between the small tube section and the large tube section, one side surface of the shim is abutted against the step surface, and another side surface of the shim is abutted against the knob.

Optionally, the knob comprises a contact piece and a handle fixedly connected to the contact piece, and the another side surface of the shim is abutted against the side surface of the contact piece facing away from the handle.

Optionally, the shim is provided with a first through hole, and the shim is sleeved on the small tube section through the first through hole.

Optionally, one side of the knob close to the base is provided with a clamping hole, and the small tube section is clamped in the clamping hole.

Optionally, a clamping slot is formed on outer side wall of the small tube section, and a block matched with the clamping slot is formed on inner side wall of the clamping hole.

Optionally, the tension lock further comprises a bolt installed on the rotating shaft;

the base comprises a base plate, and a base column connected to the base plate, the sliding hole is arranged on the base column, the axis of the sliding hole is perpendicular to the base plate, and side wall of the base column is provided with a sliding groove communicated with the sliding hole;

when the rotating shaft rotates, the bolt can slide along the sliding groove to make the rotating shaft slide along the axial direction of the sliding hole.

Optionally, the rotating shaft is provided with a second through hole, the bolt is installed in the second through hole, and the axis of the bolt is perpendicular to that of the rotating shaft.

Optionally, the tension lock further comprises an elastomeric bead mounted on the knob; and a first bead slot and a second bead slot arranged on one side surface of the shim facing the knob;

when the knob is rotated to make the shim move away from the base, the elastomeric bead can slide from the first bead slot to the second bead slot; when the knob is rotated to make the shim close to the base, the elastomeric bead can slide from the second bead slot to the first bead slot.

In another respect, the embodiment of the present application also provides an LED display screen box, comprising a rear cover, a power module, an LED display module, a box frame and a tension lock described above, wherein the box frame is fixedly connected with the LED display module, the power module is installed in the rear cover and located between the rear cover and the box frame, and one side of the power module facing the LED display module is provided with a pin header, the LED display module is provided with a female header matched with the pin header, the box frame is provided with a via hole at a position corresponding to the female header, and the pin header can pass through the via hole and be plugged into the female header;

the base is fixedly connected to the box frame, and the shim is fixedly connected to the rear cover;

when the knob is rotated to make the shim close to the base, the rear cover moves toward the LED display module to make the pin header plugged into the female header; when the knob is rotated to make the shim move away from the base, the rear cover moves in a direction away from the LED display module to unplug the pin header from the female header.

Figure 1:
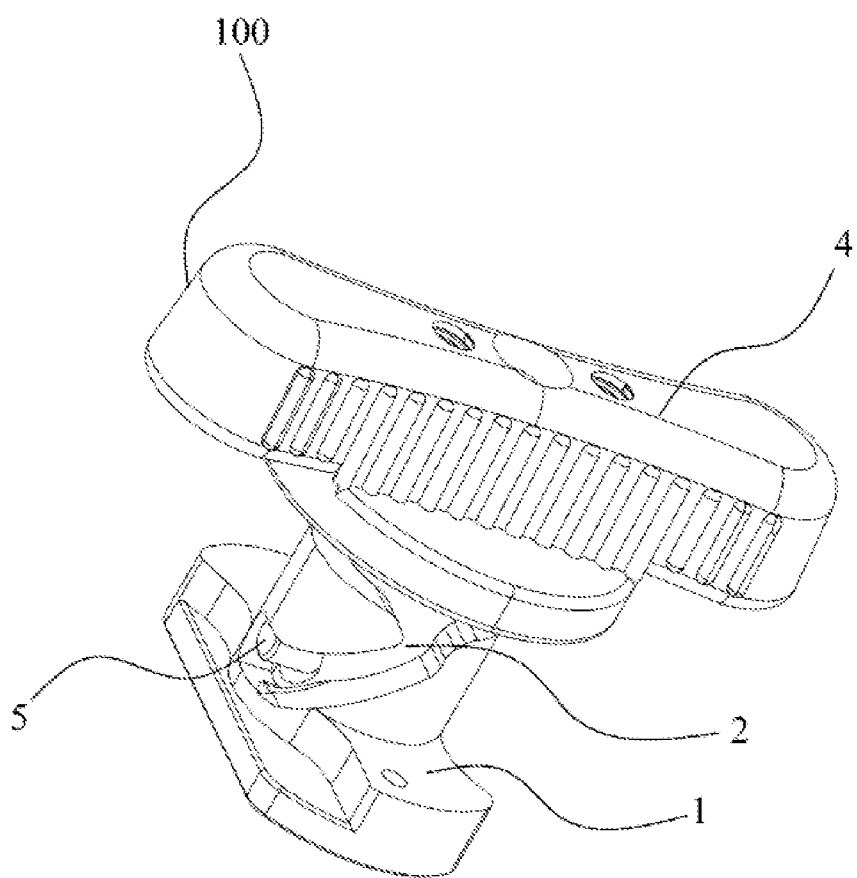
FIG. 1 is a schematic diagram of the tension lock provided by an embodiment of the present application.

Reference numerals in the specification are as follows:
100. Tension lock; 200. Rear cover; 300. Power module; 301. Pin header; 400. Led display module; 401. Female header; 500. Box frame; 501. Via hole;
1. Base; 11. Base plate; 12. Base column; 121. Sliding hole; 122. Sliding groove;
2. Rotating shaft; 21. Small tube section; 211. Clamping slot; 22. Large tube section; 221. Second through hole; 23. Step surface;
3. Shim; 31. First through hole; 32. First bead slot; 33. Second bead slot; 34. Fixing hole;
4. Knob; 41. Contact piece; 42. Handle; 43. Clamping hole;
5. Bolt;
6. Elastomeric bead.

DESCRIPTION OF DISCLOSED EMBODIMENTS

In order to make the to-be-solved technical problems, technical solutions and beneficial effects of this application clearer, the application will be described in further detail below with reference to the drawings and embodiments. It should be understood that the specific embodiments described herein are only for the purpose of explaining this application and are not intended to limit this application.

As shown in FIGS. 7 to 12, the LED display screen box provided by the embodiment of the present application includes a rear cover 200, a power module 300, an LED display module 400, a box frame 500, and a tension lock 100. The box frame 500 is fixedly connected with the LED display module 400, and the power module 300 is installed in the rear cover 200 and located between the rear cover 200 and the box frame 500. One side of the power module 300 facing the LED display module 400 is provided with a pin header 301, and the LED display module 400 is provided with a female header 401 matched with the pin header 301. The box frame 500 is provided with a via hole 501 at a position corresponding to the female header 401, and the pin header 301 can pass through the via hole 501 and be plugged into the female header 401.

As shown in FIGS. 1 to 6, the tension lock 100 provided by the embodiment of the present application comprises a base 1, a rotating shaft 2, a shim 3 and a knob 4, wherein the base 1 is provided with a sliding hole 121, one end of the rotating shaft 2 is fixedly connected with the knob 4, the other end of the rotating shaft 2 is inserted into the sliding hole 121, the shim 3 is rotationally connected with the rotating shaft 2, and the distance between the shim 3 and the knob 4 is kept constant;

turning the knob 4 can make the rotating shaft 2 rotate and slide along the axial direction of the sliding hole 121, so that the shim 3 can move away from or close to the base 1.

The base 1 is fixedly connected to the box frame 500 and the shim 3 is fixedly connected to the power module 300.

When turning the knob 4 to make the shim 3 close to the base 1, the rear cover 200 moves toward the LED display module 400 to, so the pin header 301 plugs into the female header 401. When turning the knob 4 to make the shim 3 move away from the base 1, the rear cover 200 moves away from the LED display module 400, so as to unplug the pin header 301 from the female header 401.

According to the tension lock 100 provided by the embodiment of the present application, by turning the knob 4, the rotating shaft 2 rotates and slides along the axial direction of the sliding hole 121, so that the shim 3 is away from or close to the base 1. When the tension lock 100 is applied to the auxiliary installation of the LED display screen box, base 1 is fixedly connected to box frame 500 and shim 3 is fixedly connected to rear cover 200. Turning the knob 4, when rotating shaft 2 slides along the axial direction of the sliding hole 121 toward the direction of base 1, shim 3 will gradually approach base 1, and shim 3 will drive rear cover 200 to gradually approach box frame 500 to assist the connection between rear cover 200 and box frame 500. When rotating shaft 2 slides along the axial direction of sliding hole 121 in the direction away from base 1, shim 3 will gradually move away from base 1, and shim 3 will drive rear cover 200 to gradually move away from box frame 500, so as to gradually disconnect rear cover 200 from box frame 500 to separate rear cover 200 from box frame 500. According to the tension lock 100 provided by the embodiment of the invention, the installation and disassembly of the LED display screen box can be faster and more convenient, and the installation efficiency of the LED display screen box can be effectively improved.

Figure 2:
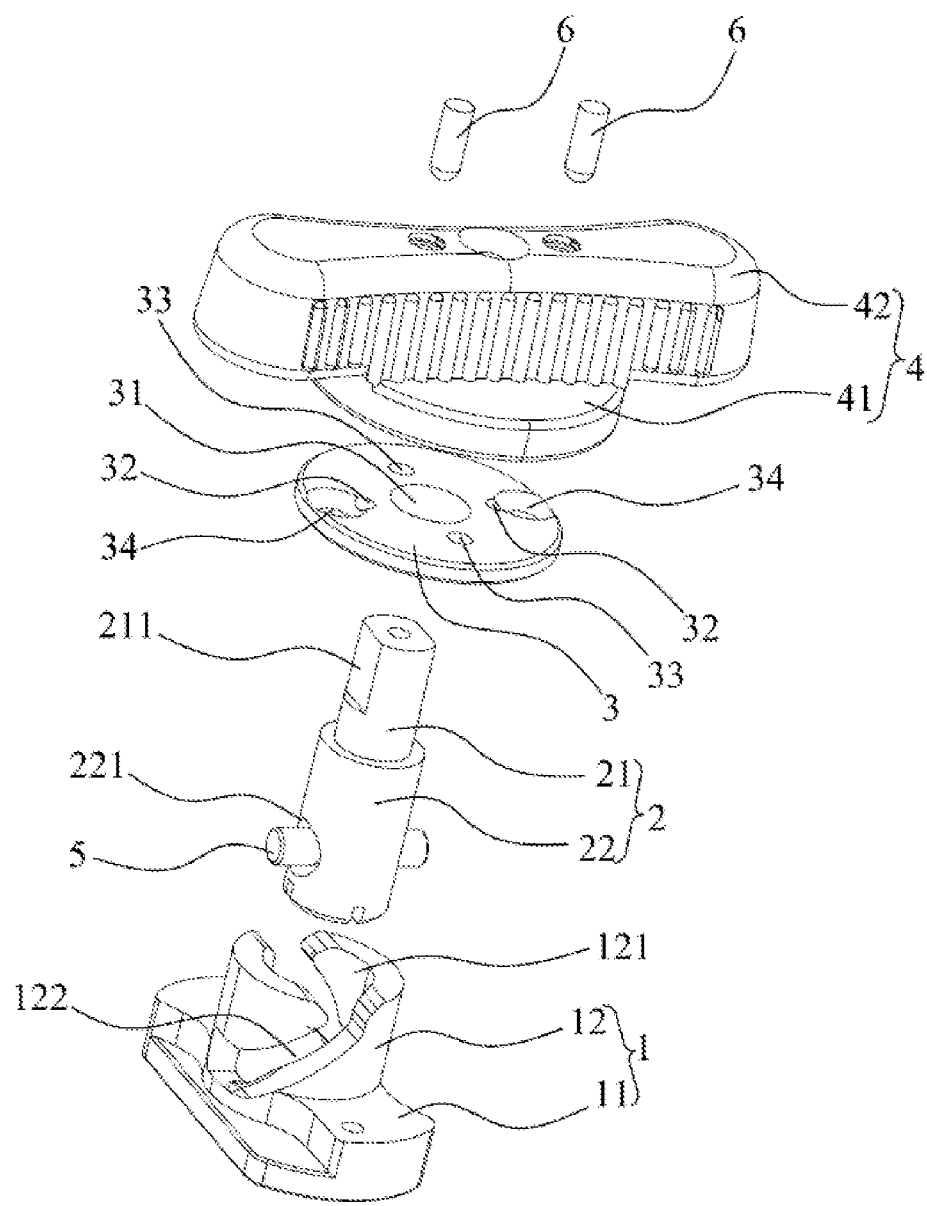
FIG. 2 is an exploded view of the tension lock provided by an embodiment of the present application.
Figure 3:
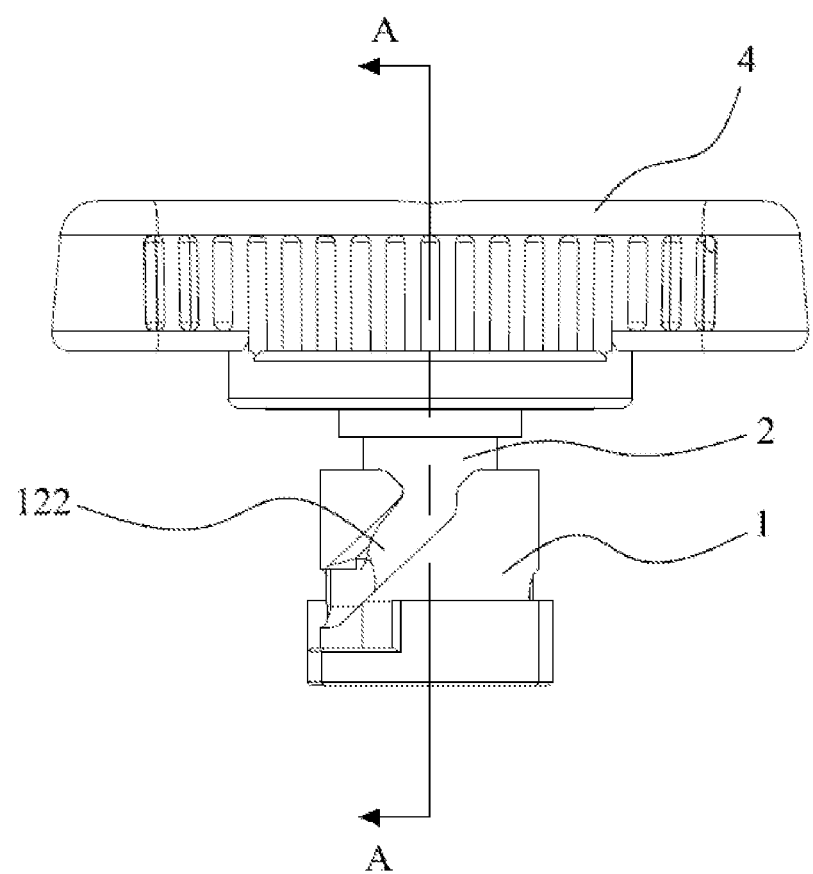
FIG. 3 is a schematic view of another angle of the tension lock provided by an embodiment of the present application.

In one embodiment, as shown in FIG. 2, the rotating shaft 2 comprises a small tube section 21 and a large tube section 22, wherein the small tube section 21 is fixedly connected with the knob 4, and the large tube section 22 is inserted into the sliding hole 121 and can slide along the axial direction of the sliding hole 121.

A step surface 23 is formed between the small tube section 21 and the large tube section 22, one side surface of the shim 3 is abutted against the step surface 23, and the other side surface of the shim 3 is abutted against the knob 4.

When the rotating shaft 2 moves along the axial direction of the sliding hole 121, because the shim 3 abuts against the step surface 23 and knob 4, the shim 3 will move in the axial direction of the sliding hole 121 along with the rotating shaft 2, thereby making the shim 3 close to or away from the base 1.

In one embodiment, as shown in FIG. 2, the knob 4 includes a contact piece 41 and a handle 42 fixedly connected to the contact piece 41, and the other side surface of the shim 3 abuts against the side surface of the contact piece 41 facing away from the handle 42.

The handle 42 makes it is easy to turn the knob 4. The surface on which the contact piece 41 abuts the shim 3 is flat, so that the contact between the shim 3 and the contact piece 41 is more stable, and the shim 3 is more stably driven to move.

In one embodiment, as shown in FIG. 2, the shim 3 is provided with a first through hole 31, and the shim 3 is sleeved on the small tube section 21 through the first through hole 31 to, so that the shim 3 can be rotationally connected to the rotating shaft 2, and the distance between the shim 3 and the knob 4 can be kept constant.

Figure 4:
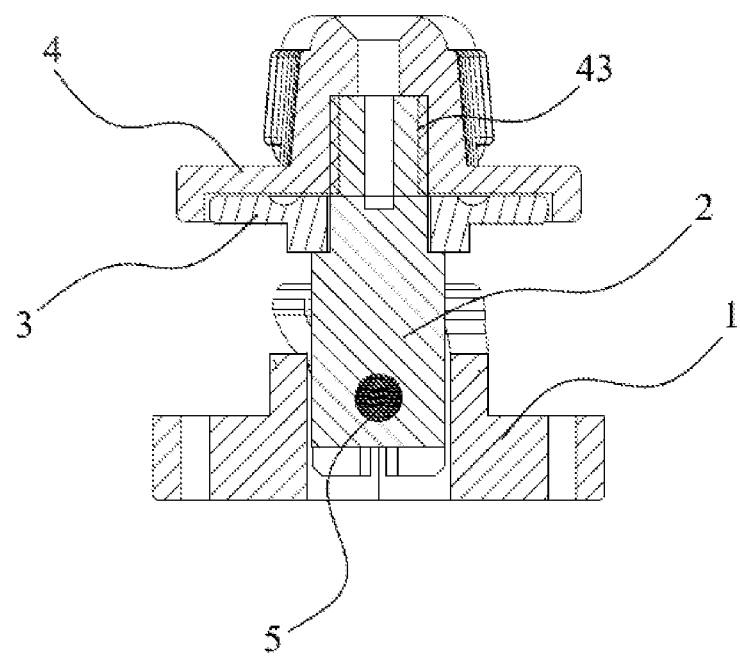
FIG. 4 is a sectional view of A-A in FIG. 3.

In one embodiment, as shown in FIGS. 2 and 4, a clamping hole 43 is provided on one side of the knob 4 close to the base 1, and the small tube section 21 is clamped in the clamping hole 43 to fixedly connect the rotating shaft 2 with the knob 4.

In one embodiment, as shown in FIGS. 2 and 4, a clamping slot 211 is formed on the outer side wall of the small tube section 21, and a block matched with the clamping slot 211 is formed on the inner side wall of the clamping hole 43 so as to clamp the small tube section 21 in the clamping hole 43.

In one embodiment, as shown in FIG. 2, the tension lock 100 further includes a bolt 5 installed on the rotating shaft 2.

The base 1 includes a base plate 11 and a base column 12 connected to the base plate 11, the sliding hole 121 is arranged on the base column 12, the axis of the sliding hole 121 is perpendicular to the base plate 11, and the side wall of the base column 12 is provided with a sliding groove 122 communicated with the sliding hole 121.

When the rotating shaft 2 rotates, the bolt 5 can slide along the sliding groove 122 to make the rotating shaft 2 slide in the axial direction of the sliding hole 121.

Figure 5:
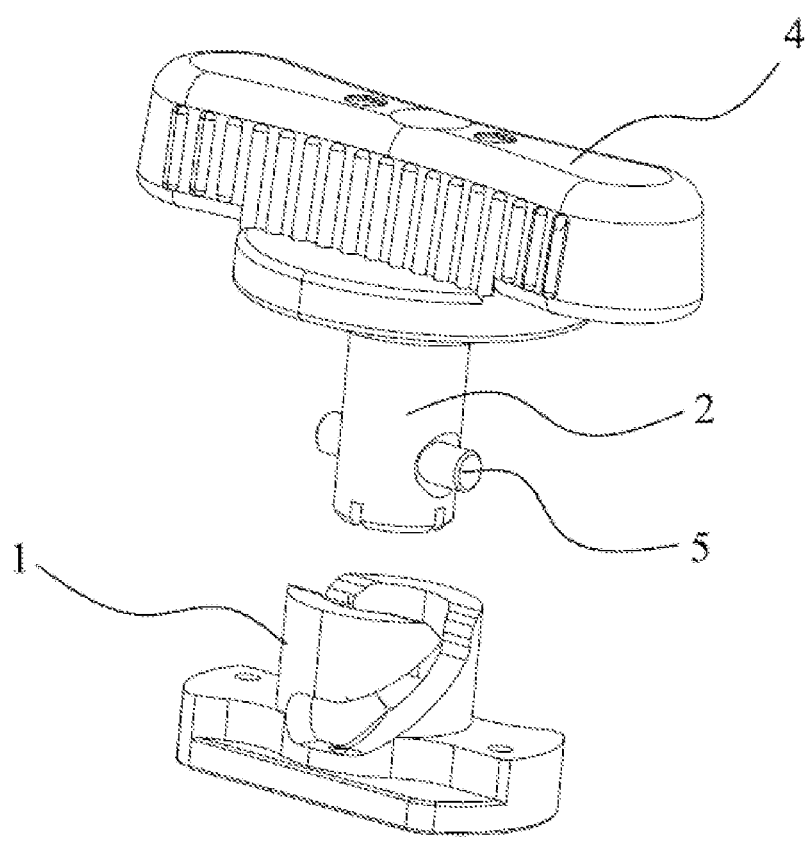
FIG. 5 is a first state diagram of the tension lock provided by an embodiment of the present application (when shim is away from base)
Figure 6:
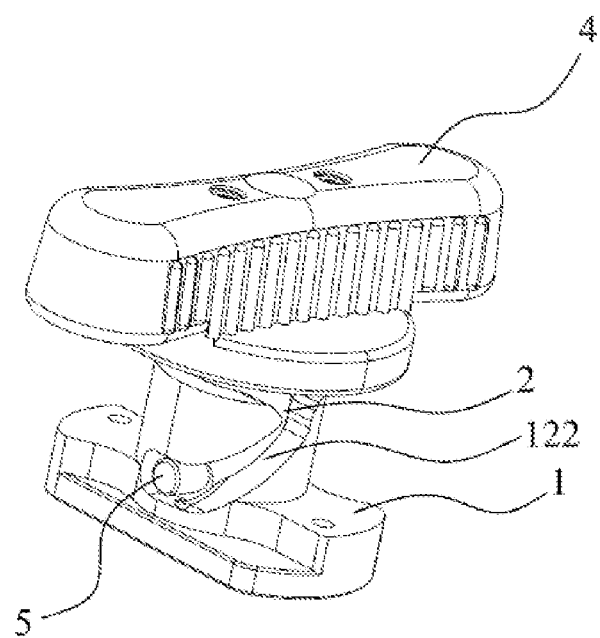
FIG. 6 is a second state diagram of the tension lock provided by an embodiment of the present application (when shim is close to base)
Figure 7:
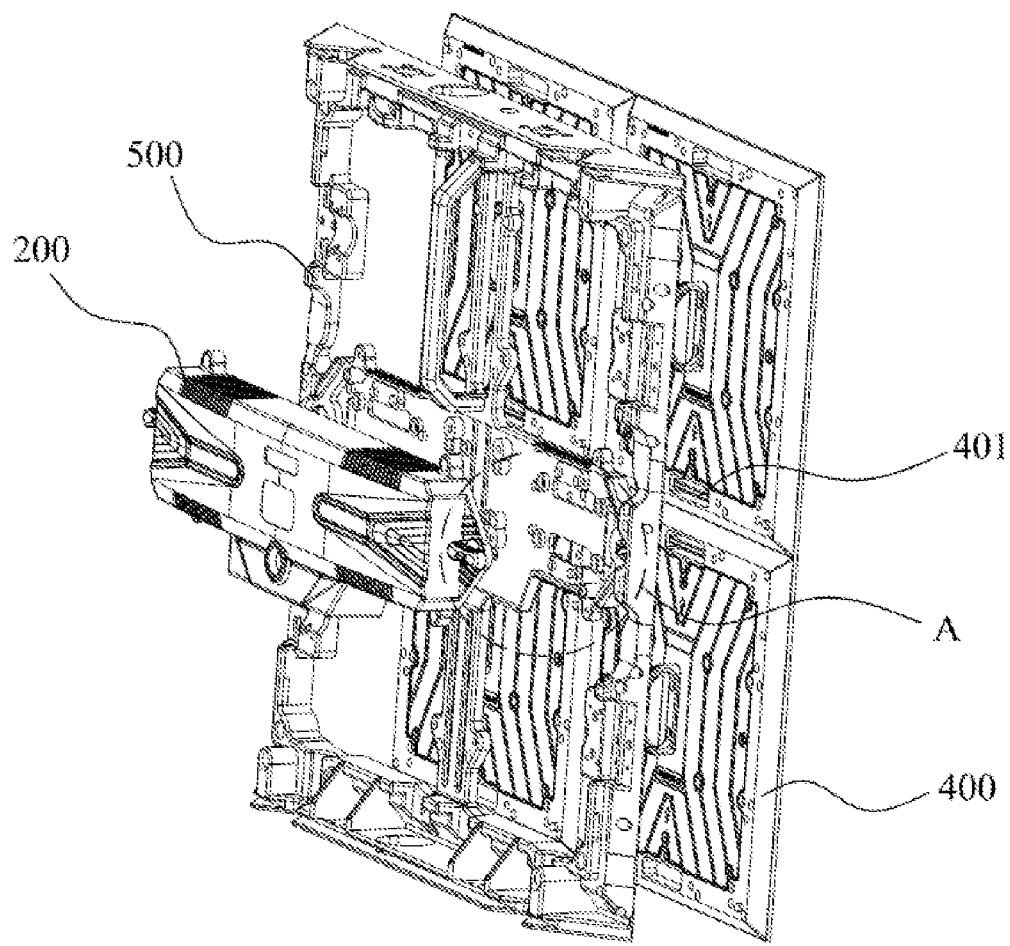
FIG. 7 is an exploded view of the LED display screen box provided by an embodiment of the present application.
Figure 8:
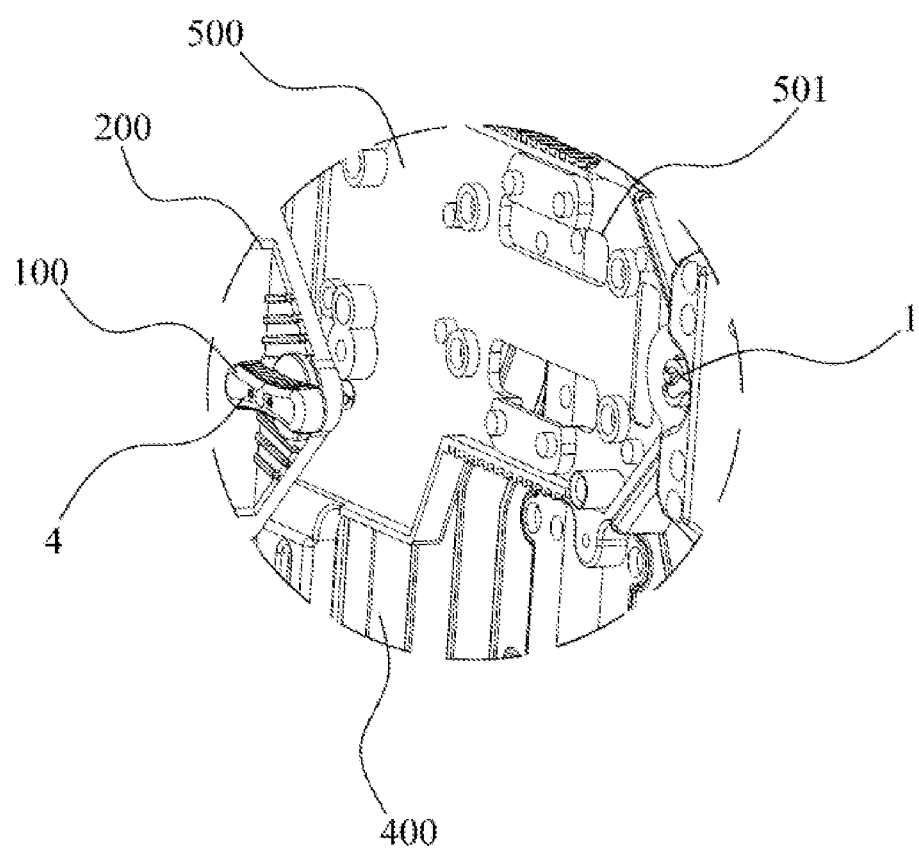
FIG. 8 is an enlarged view of A in FIG. 7.
Figure 9:
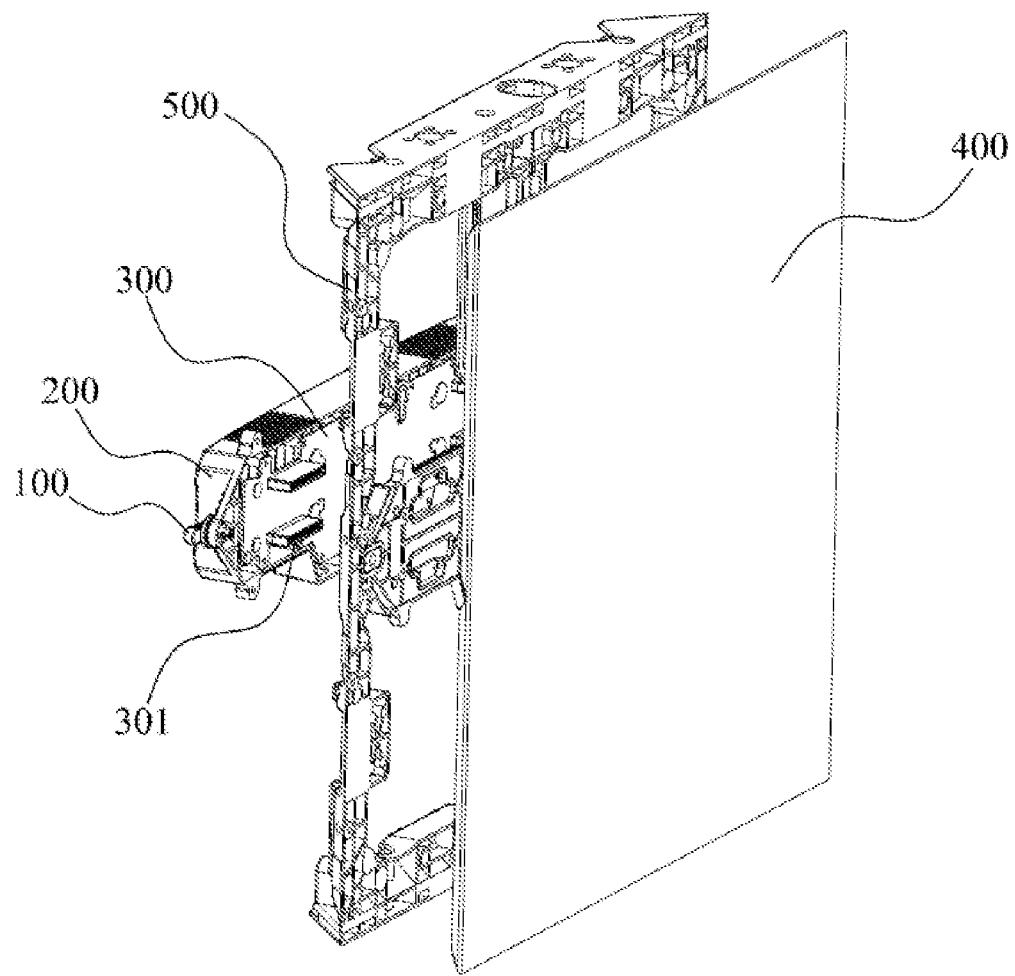
FIG. 9 is an exploded view of another angle of the LED display screen box provided by an embodiment of the present application.
Figure 10:
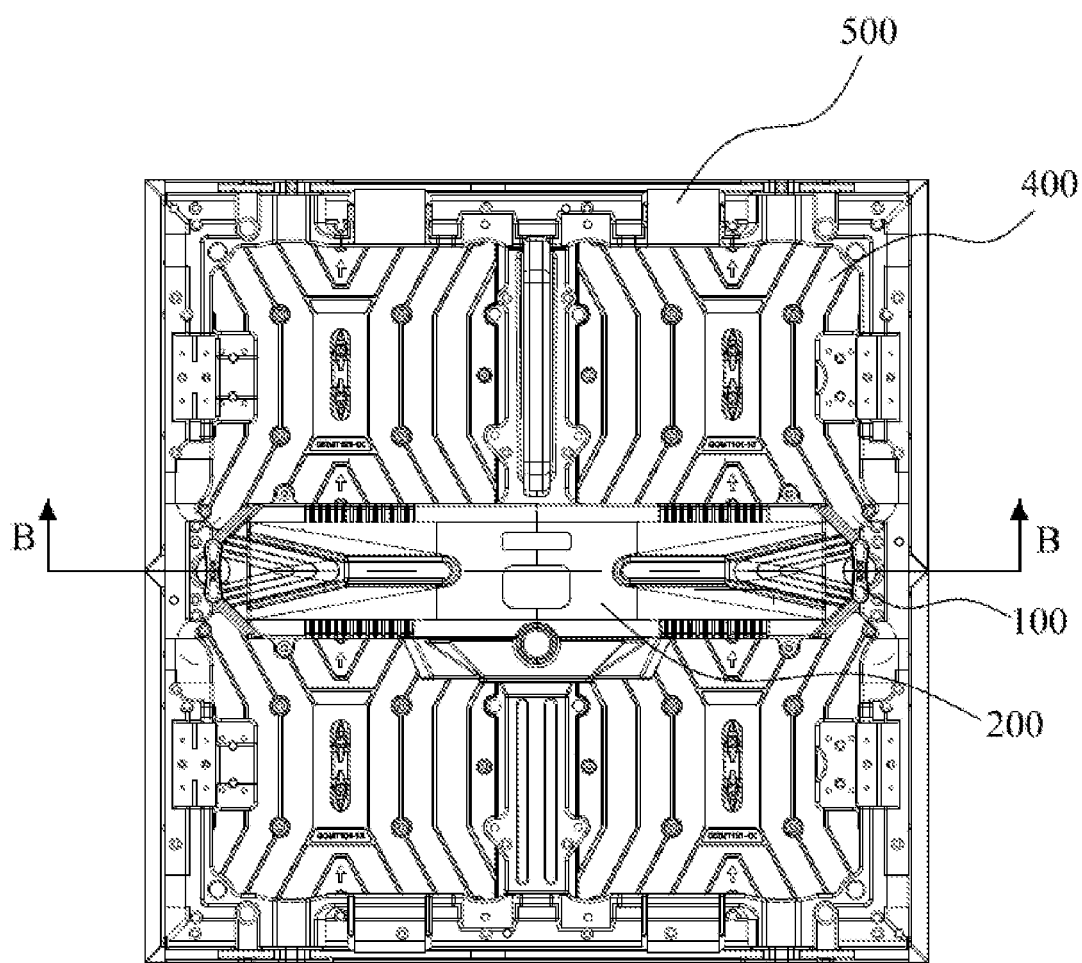
FIG. 10 is a schematic diagram of the LED display screen box provided by an embodiment of the present application.
Figure 11:
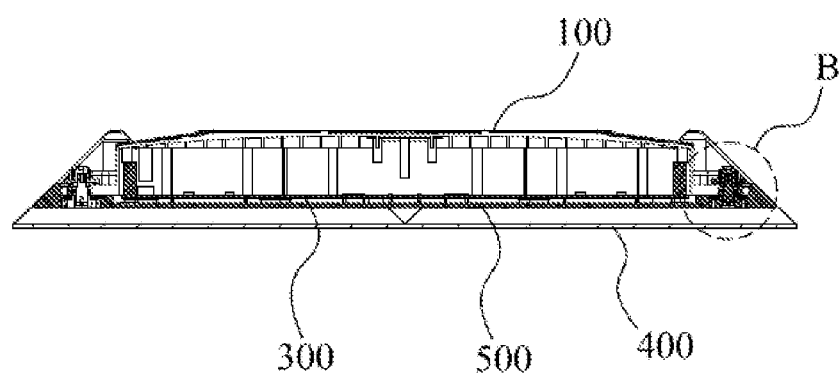
FIG. 11 is a sectional view of B-B in FIG. 10.

In one embodiment, as shown in FIG. 2, the sliding groove 122 is obliquely disposed on the side wall of the base column 12. As shown in FIG. 5, when rotating the rotating shaft 2 to gradually approach the shim 3 to the base 1, the bolt 5 will first slide into the sliding groove 122 toward an opening of the knob 4. When rotating the rotating shaft 2, as shown in FIG. 6, the bolt 5 will slide along the sliding groove 122 to the side of the sliding groove 122 facing away from the knob 4, so as to make the shim 3 gradually approach the base 1, thereby driving the rear cover 200 to move to the LED display module 400, and plugging the pin header 301 to the female header 401, thus completing the installation of the LED display screen box.

In one embodiment, as shown in FIG. 2, the rotating shaft 2 is provided with a second through hole 221, the bolt 5 is installed in the second through hole 221, and the axis of the bolt 5 is perpendicular to the axis of the rotating shaft 2 to facilitate setting the sliding groove 122 and making the bolt 5 slides along the sliding groove 122.

In one embodiment, as shown in FIG. 2, the tension lock 100 further includes an elastomeric bead 6 mounted on the knob 4. The surface of the shim 3 facing the knob 4 is provided with a first bead slot 32 and a second bead slot 33.

When rotating the knob 4 to make the shim 3 move away from the base 1, the elastomeric bead 6 can be slid from the first bead slot 32 to the second bead slot 33. When rotating the knob 4 to bring the shim 3 close to the base 1, the elastomeric bead 6 can be slid from the second bead slot 33 to the first bead slot 32.

The elastomeric bead 6 and shim 3 are matched by a clamping point, and the elastomeric bead 6 adopts an extrudable elastic structure to strengthen hand feeling and facilitate the locking effect.

In one embodiment, as shown in FIG. 2, two elastomeric beads 6 are provided, correspondingly, two first slots 32 and two second slots 33 are provided. The central connecting line of the two first slots 32 is perpendicular to the central connecting line of the two second slots 33, so that the knob 4 can be locked after rotating at 90°, thus realizing the auxiliary installation of the LED box.

In order to lock the knob 4 after rotating 90 degree, the setting of the sliding groove 122 should ensure that when the knob 4 rotates 90 degree, the bolt 5 can slide from the sliding groove 122 toward an opening of the knob 4 to the side of the sliding groove 122 facing away from the knob 4. The distance that the knob 4 moves along the axial direction of the sliding hole 121 should not be less than the length of the pin header 301, so as to realize complete plug-in between the pin header 301 and the female header 401.

Figure 12:
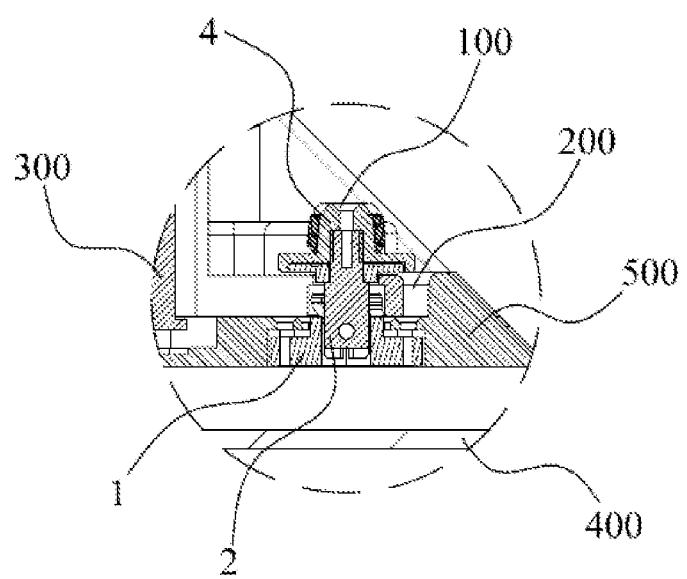
FIG. 12 is an enlarged view of B in FIG. 11.

In one embodiment, as shown in FIGS. 2 and 12, the shim 3 is provided with a fixing hole 34, the shim 3 is fixedly connected to the rear cover 200 through the fixing hole 34, and the base 1 is fixedly connected to the box frame 500.

The above descriptions are only preferred embodiments of the present invention and are not intended to limit the present invention. Any modification, equivalent substitution and improvement made within the spirit and principles of the present invention shall be included within the scope of protection of the present invention. Further, unless otherwise required by context, singular terms shall include pluralities and plural terms shall include the singular. Thus, as used herein and in the claims, the singular forms include the plural reference and vice versa unless the context clearly indicates otherwise.

What is claimed is:

1. A tension lock, comprising a base, a rotating shaft, a shim and a knob, wherein the base is provided with a sliding hole, one end of the rotating shaft is fixedly connected with the knob, the other end of the rotating shaft is inserted into the sliding hole, the shim is rotationally connected with the rotating shaft, and the distance between the shim and the knob is kept constant;
   turning the knob can make the rotating shaft rotate and slide along the axial direction of the sliding hole, so that the shim can move away from or close to the base;
   the tension lock further comprises an elastomeric bead mounted on the knob; and
   a first bead slot and a second bead slot arranged on one side surface of the shim facing the knob; and
   when the knob is rotated to make the shim move away from the base, the elastomeric bead can slide from the first bead slot to the second bead slot; when the knob is rotated to make the shim close to the base, the elastomeric bead can slide from the second bead slot to the first bead slot.

2. The tension lock according to claim 1, wherein the rotating shaft comprises a small tube section and a large tube section, the small tube section is fixedly connected with the knob, and the large tube section is inserted into the sliding hole and can slide along the axial direction of the sliding hole;

a step surface is formed between the small tube section and the large tube section, one side surface of the shim is abutted against the step surface, and another side surface of the shim is abutted against the knob.

3. The tension lock according to claim 2, wherein the knob comprises a contact piece and a handle fixedly connected to the contact piece, and the another side surface of the shim is abutted against the side surface of the contact piece facing away from the handle.

4. The tension lock according to claim 2, wherein the shim is provided with a first through hole, and the shim is sleeved on the small tube section through the first through hole.

5. The tension lock according to claim 2, wherein one side of the knob close to the base is provided with a clamping hole, and the small tube section is clamped in the clamping hole.

6. The tension lock according to claim 5, wherein a clamping slot is formed on outer side wall of the small tube section, and a block matched with the clamping slot is formed on inner side wall of the clamping hole.

7. The tension lock according to claim 1, wherein the tension lock further comprises a bolt installed on the rotating shaft;

the base comprises a base plate, and a base column connected to the base plate, the sliding hole is arranged on the base column, the axis of the sliding hole is perpendicular to the base plate, and side wall of the base column is provided with a sliding groove communicated with the sliding hole;

when the rotating shaft rotates, the bolt can slide along the sliding groove to make the rotating shaft slide along the axial direction of the sliding hole.

8. The tension lock according to claim 7, wherein the rotating shaft is provided with a second through hole, the bolt is installed in the second through hole, and the axis of the bolt is perpendicular to that of the rotating shaft.

9. An LED display screen box, comprising a rear cover, a power module, an LED display module, a box frame and a tension lock according to claim 1, wherein the box frame is fixedly connected with the LED display module, the power module is installed in the rear cover and located between the rear cover and the box frame, and one side of the power module facing the LED display module is provided with a pin header, the LED display module is provided with a female header matched with the pin header, the box frame is provided with a via hole at a position corresponding to the female header, and the pin header can pass through the via hole and be plugged into the female header;

the base is fixedly connected to the box frame, and the shim is fixedly connected to the rear cover;

when the knob is rotated to make the shim close to the base, the rear cover moves toward the LED display module to make the pin header plugged into the female header; when the knob is rotated to make the shim move away from the base, the rear cover moves in a direction away from the LED display module to unplug the pin header from the female header.

\* \* \* \* \*